April 17, 1962 I. M. METH 3,030,585

FREQUENCY-MODULATION DETECTOR CIRCUIT

Filed May 9, 1957

INVENTOR.
IRVING M. METH
BY
H. L. Newton
ATTORNEY 3,030,585
FREQUENCY-MODULATION DETECTOR CIRCUIT
Irving Marvin Meth, Brooklyn, N.Y., assignor to Radio Corporation of America, a corporation of Delaware
Filed May 9, 1957, Ser. No. 658,195
7 Claims. (Cl. 329—103)

This invention relates to frequency modulation detector circuits, and more particularly to locked oscillator, slope detector circuits utilizing transistors for demodulating a frequency modulated wave.

In the reception of a wave which has been frequency modulated by a signal, it is desirable to provide a receiver which is responsive solely to the frequency variations of the wave and not to any spurious amplitude modulation appearing on the wave. Amplitude limiting means may be provided in the receiver to remove the spurious amplitude variations before the wave is detected, and the sensitivity of the entire system is limited to the minimum signal level at which the limiting means will function properly. Also, certain frequency modulation detector circuits are known that have an output signal which is not a function of the input wave amplitude. Transistors may be utilized in many of the presently known detector circuits, but they also lend themselves to new and improved types of detector circuits.

It is an object of this invention to provide an improved frequency-modulation detector circuit utilizing transistors that provides a high degree of amplitude modulation rejection.

It is another object of this invention to provide an improved transistor frequency-modulation detector circuit utilizing locked oscillations to provide amplitude modulation rejection and increased sensitivity.

It is a further object of this invention to provide an improved transistor frequency-modulation detector having a high degree of sensitivity and amplitude modulation rejection at a minimum of cost and complication.

In accordance with the invention, a transistor oscillator circuit is locked to the frequency of an incoming frequency modulated wave. A tuned circuit in the output circuit of the transistor functions as a part of the oscillator, and means are provided to restrict the frequency of self oscillation to one side of the resonant frequency of the tuned circuit, so that the oscillator frequency falls on the slope of one side of the resonance curve of the tuned circuit. The received frequency modulated wave, which has a center frequency nominally equal to the oscillator frequency, is injected into the oscillator and the frequency of the oscillator locks in with the frequency of the received wave. As the frequency of the oscillator deviates in accordance with the received wave, the impedance of the tuned circuit in the output circuit varies in magnitude and direction in accordance with the magnitude and direction of the frequency variations of the incoming wave. The average output current is thus the detected output signal. Amplitude modulation rejection is provided by the limiting action of the locked oscillator.

The invention will be further understood when the following description is read with reference to the accompanying drawings, in which.

Figure 1:
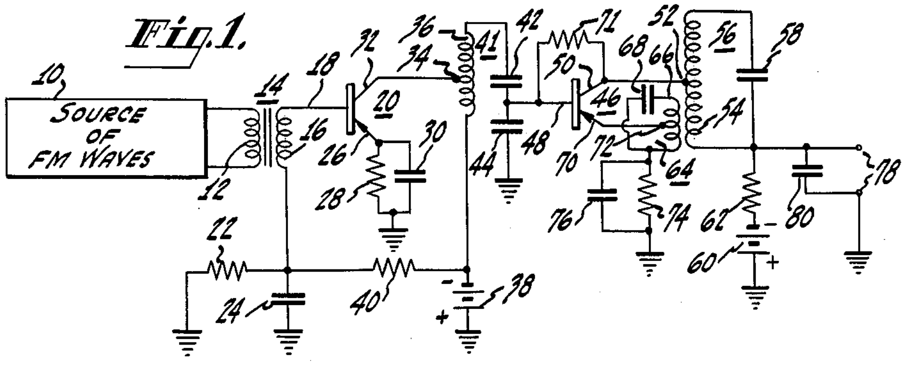
FIGURE 1 is a schematic circuit diagram of a frequency modulation detector illustrating an embodiment of the invention.

Referring now to the drawing, and in particular to FIG-

URE 1, a frequency modulated wave is derived from a source of frequency modulated waves 10, which may be a television receiver, a frequency modulation receiver, or other source. The wave is applied to an oscillator-detector transistor 46 through a driver amplifier which comprises a driver amplifier transistor 20 and its associated circuitry. Specifically, the frequency modulated wave is applied to the primary winding 12 of a wave input transformer 14 having its secondary winding 16 connected at one end directly to the base electrode 18 of the driver transistor 20, and at the other end to ground, or a point of reference potential for the circuit, through the parallel combination of a bias resistor 22 and a bypass capacitor 24. The emitter electrode 26 of the transistor 20 is connected to ground through an emitter resistor 28 in parallel with a bypass capacitor 30, and the collector electrode 32 is connected to a tap point 34 on an output inductor 36. A parallel resonant or tank circuit 41, resonant at the center frequency of the frequency modulated wave, is provided by connecting a pair of capacitors 42 and 44, in series between one end of the inductor 36 and ground.

Energizing current is supplied to the transistor 20 by connecting the negative terminal of a battery 38 to the inductor 36 and the positive terminal to ground. Bias is supplied to the base electrode 18 by connecting a resistor 40 between the negative terminal of the battery 38 and the junction of the bias resistor 22 and the secondary winding 16 of the input transformer 14.

The frequency modulated wave is amplified and appears across the driver tank circuit 41. The amplifier wave is applied to the input circuit of the oscillator-detector transistor 46 by connecting the base electrode 48 to a low impedance tap at the junction of the capacitors 42 and 44 in the driver tank circuit 41.

The oscillator is operated as a grounded base oscillator with the base electrode 48 connected to signal ground potential by the capacitor 44. The output circuit includes the collector electrode 50 which is connected to a tap point 52 on the inductor 54 of a collector tank ciriuit 56. The inductor 54 is tuned by a capacitor 58 connected thereacross. Energizing current is supplied to the collector electrode 50 by connecting the negative terminal of a second battery 60 through a load resistor 62 to the collector tank 56. Feedback to sustain oscillations in the circuit, which action will be more fully described hereinafter, is through an emitter tank circuit 64, which has an inductor 66 inductively coupled to the inductor 54 in the collector tank circuit 56. A tuning capacitor 68 is connected across the inductor 66, and the emitter electrode 70 is connected to a matching impedance tap point 72 on the inductor 66. A direct current return for the emitter electrode 70 is provided by a resistor 74 connected between one side of the emitter tank circuit 64 and ground. A bypass capacitor 76 is connected across the direct current return resistor 74. The base electrode 48 is biased by connecting a biasing resistor 71 directly between the base electrode 48 and the collector electrode 50.

The demodulated output signal is derived across the load resistor 62 and is available at a pair of output terminals 78, one of which is connected to ground and the other of which is connected to the junction of the load resistor 62 and the collector tank circuit 56. A bypass capacitor 80 is connected across the load resistor 62 and the battery 60 to bypass any components of the oscillator signal appearing at the output terminals 78.

In operation, with no frequency modulated wave applied to the circuit, self oscillations are generated in the oscillator-detector circuit at substantially the center frequency of the frequency modulated wave to be detected. In accordance with the invention, the self oscillations are restricted to one side of the response curve of the collector electrode tank circuit 56, by tuning the collector tank circuit 56 in the output circuit of the transistor 46 to a frequency higher than the frequency of oscillations desired. The feedback to sustain oscillations is derived by coupling the inductor 66 of the emitter tank circuit 64 to the inductor 54 of the collector tank circuit 56. This coupling is on the order of critical coupling. The emitter tank circuit 64 is tuned to approximately the same frequency as the collector tank circuit 56, in which case the voltage induced in the emitter tank circuit 64 will be in quadrature with that existing in the collector tank circuit 56, at the resonant frequency of the tank circuits. Thus, oscillations cannot exist at the resonant frequency of the collector tank circuit 56. At a frequency lower than the resonant frequency of the collector tank circuit 56, however, the phase shift of the feedback signal will be zero, thus the voltage fed back from the collector electrode 50 through the collector tank circuit 56 to the emitter electrode 70 will be regenerative and the circuit will oscillate at this frequency.

Figures 2, 3:
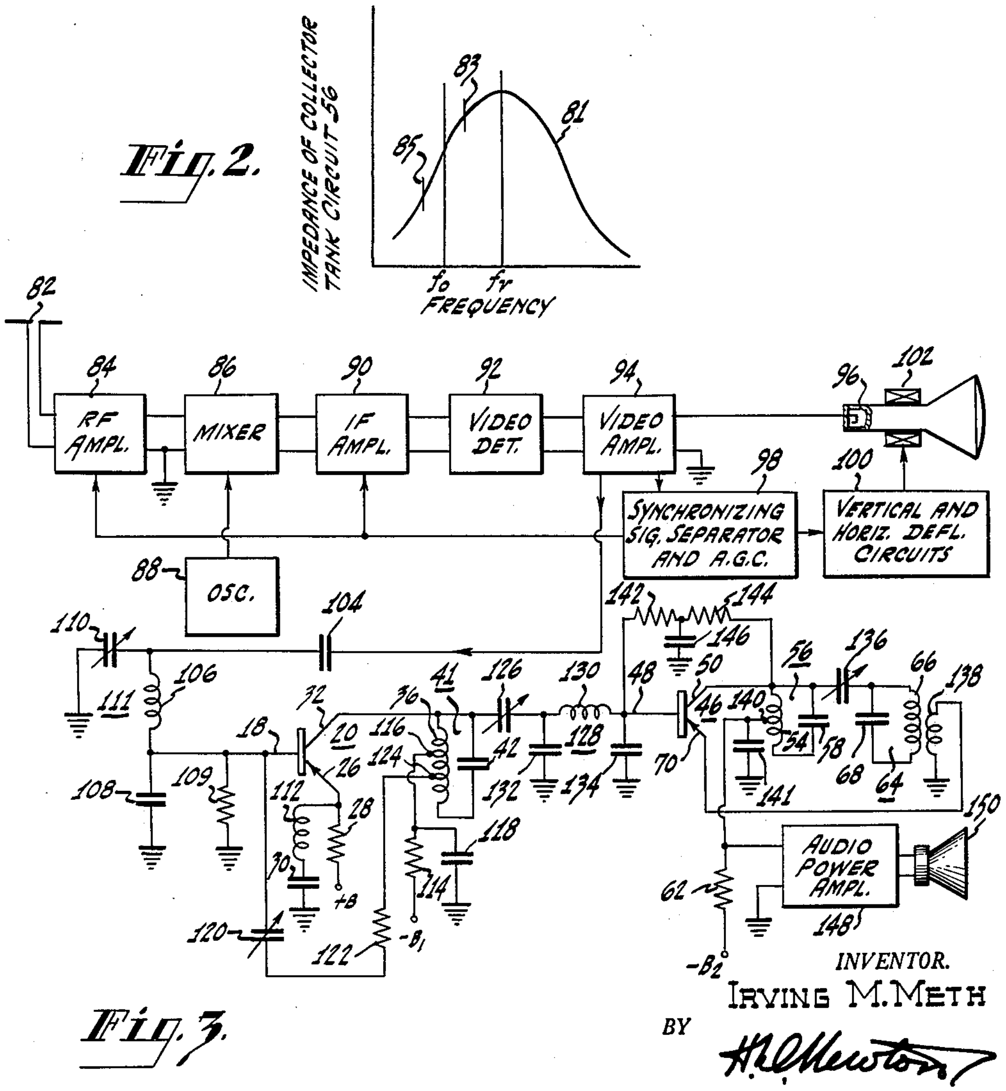
FIGURE 2 is a graph showing curves illustrating certain operational features of the detector of FIGURE 1.
FIGURE 3 is a schematic circuit diagram of a television receiver having a frequency modulation detector circuit illustrating another embodiment of the invention.

At this point in the description of the operation, with no signal being applied, the oscillator-detector circuit is oscillating at a frequency which falls on the lower side of the response or resonance curve of the collector tank circuit 56. This is indicated in FIGURE 2, which is a curve 81 of the impedance of the collector tank circuit 56 plotted against frequency. The frequency of oscillations, $f_o$, is seen to be at a lower frequency than the resonant frequency of the tank circuit 56, $f_r$. Oscillations cannot exist on the upper side of the resonance curve 81 of the collector tank circuit 56, since the phase shift at a frequency above resonance between the voltages in the collector and emitter tank circuits 56 and 64 is nearer 180°, and the feedback is thus degenerative.

The oscillator is operated so that the positive excursions of the collector voltage are clamped at the break down level of the transistor. The discharge time of the clamping action is determined by the time constant in the collector electrode circuit, and this time constant is that of the load resistor 62 and the bypass capacitor 80. Typical values for these components are 10,000 ohms and .001 microfarad, resulting in a time constant of 10 microseconds which is large, for example, compared to a period of a 4.5 mc. wave as used in an intercarrier television receiver. The negative excursions of the oscillator signal on the collector electrode 50 are limited by the available supply voltage, that of the battery 60, and the resistance of the load resistor 62. The amplitude of the self oscillations are limited in magnitude by this action, and the detected audio output signal is independent of the wave input amplitude.

If now a frequency modulated wave from the source 10 is applied to the driver transistor 20 and is amplified and injected into the base electrode 48 of the oscillator-detector transistor 46, the injected signal will lock the frequency of the oscillations of the oscillator-detector circuit into the frequency of the wave. Thus, as the frequency of the wave deviates in accordance with its modulation signal, the frequency of the oscillator will deviate in the same manner. Since the oscillations exist on the slope of the resonance curve 81 of the tank circuit 56 (see FIGURE 2), the impedance of the tank circuit 56 in the output circuit will vary as the frequency of oscillations vary. The limits of the deviations are noted as points 83 and 85 on the curve 81, which is on the steep slope of the curve and is nearly linear. The average output or collector current of the transistor 46 is a function of the impedance of the collector tank circuit 56, and the modulating signal of the wave will thus be reflected in the average collector current. The collector current flows through the load resistor 62 and the detected output signal voltage is developed across the load resistor 62, and is available at the output terminals 78.

The oscillator-detector circuit provides rejection of any spurious amplitude modulation that may appear in the frequency modulated wave, since the amplitude of self oscillations is limited as previously explained, and variations in the amplitude of the frequency modulated wave will not substantially change the amplitude of oscillations. The average collector current is thus a function only of the impedance of the collector tank circuit 56 which, as has been previously described, is a function only of the frequency deviation of the oscillator signal as controlled by the applied frequency wave. The sensitivity of the system is greater than the detector circuit directly driven by the frequency modulated wave, since less signal is required to lock the oscillator detector circuit than is required to limit a signal, utilizing the same number of stages.

If a push pull output signal is desired, a demodulated signal, opposite in phase to that at the output terminals 78, may be taken from across the emitter direct current return resistor 74 of the oscillator-detector transistor 46.

Referring now to FIGURE 3, another embodiment of the invention is illustrated in conjunction with an intercarrier sound television receiver. The transmitted television signal is received on an antenna 82 and applied to a radio frequency amplifier 84 where it is amplified and applied to a mixer circuit 86. The transmitted television signal consists of two radio frequency carrier waves spaced 4.5 mcs. apart according to present day standards, an amplitude modulated video carrier and a frequency modulated audio carrier. In the mixer circuit 86 the received signal is heterodyned with the signal from a local oscillator 88 to produce a pair of intermediate frequency carriers which are amplified in an intermediate frequency amplifier and applied to a video detector 92. The intermediate frequency carriers are spaced exactly 4.5 megacycles apart. One intermediate frequency carrier is modulated with the required video and synchronizing signals for the television receiver and the other intermediate frequency carrier is frequency modulated with the sound or audio information. The video intermediate frequency is detected in the video detector 92 and the video and sound intermediate frequency carriers are heterodyned in the detector to produce a 4.5 magacycle frequency modulated sound carrier. In most receivers the detected video signal and the 4.5 megacycle frequency modulated audio carrier are applied to the video amplifier 94, as here shown. The video signal is amplified and applied to the kinescope 96 and the synchronizing information is separated from the video signal by the synchronizing signal separator circuit 98, where an automatic gain control voltage is developed to apply to the radio frequency and intermediate frequency amplifier 84 and 90, and the synchronizing information is supplied to the vertical and horizontal deflection circuits 100 which develop the proper voltages and currents to apply to the deflection yoke 102 to properly deflect the electron beam of the kinescope 96.

The frequency modulated 4.5 mc. sound carrier is separated from the video amplifier 94 and applied through an impedance matching "pie" network 111, comprising a series inductor 106 and shunt capacitors 108 and 110, to the base electrode 18 of the driver transistor 20. The combination of the inductor 106 and the variable capacitor 110 are tuned to resonance at 4.5 mcs. A base electrode return resistor 109 is connected between the base electrode 18 and a source of bias voltage, +B, positive with respect to ground. The inductor 112, which may be the lead inductance of the capacitor 30, is series resonant with the capacitor 30 at approximately 4.3 megacycles to provide that the emitter-to-base feedback is degenerative and prevent spurious oscillations. The carrier is amplified in the driver transistor 20 and is available across the driver tank circuit 41 which comprises the output inductor 36 and the capacitor 42. Energizing current is supplied to the collector electrode 32 by connecting a source of energizing potential, $-B_1$, through a resistor 114 to a first tap point 116 on the inductor 36. The resistor 114 is bypassed to ground for signal frequencies by a bypass capacitor 118. Neutralization of the amplifier is provided by connecting a neutralizing capacitor 120 in series with a neutralizing resistor 122 between a second tap point 124 on the inductor 36 and the base electrode 18.

The amplified carrier appearing across the driver tank circuit 41 is applied through a capacitor 126 and a second "pie" network 128 to the base electrode 48 of the oscillator-detector transistor 46. The second "pie" network comprises an inductor 130 connected in series with the signal path and a pair of capacitors 132 and 134 connected in shunt with the signal path and serves to prevent spurious oscillations from occurring in the oscillator-detector circuit. The collector electrode 50 of the oscillator-detector transistor 46 is connected directly to one side of the collector tank circuit 56, which comprises the inductor 54 and the capacitor 58. The collector tank circuit 56 is connected to the emitter tank circuit 64, comprising the inductor 66 and the capacitor 68, by a variable capacitor 136 to provide "high side" capacity coupling between the two tank circuits. The "high side" capacity coupling between the tank circuits 56 and 64 provides the same action with respect to the feedback voltage as does the inductivity coupled inductors of FIGURE 1, and the developed voltage in the emitter tank circuit 64 is link-coupled by an inductor 138 directly to the emitter electrode 70.

Operating potential is supplied to the collector electrode 50 from a second source of energizing potential, $-B_2$, through a load resistor 62, bypassed at wave frequencies by a bypass capacitor 141, and connected to an intermediate tap point 140 on the inductor 54 . The base electrode 48 is biased through a pair of serially connected resistors 142 and 144 between the base electrode 48 and the collector electrode 50. Signal bypassing for the base electrode biasing resistors 142 and 144 is provided by a capacitor 146 connected between the junction of the two resistors and ground. The detected output signal is developed across the load resistor 62 and applied to an audio power amplifier 148, where the signal is amplified and applied to a loudspeaker 150.

Although the circuit configuration is slightly different from that shown in FIGURE 1, the operation is substantially identical. The frequency modulated wave, here the 4.5 megacycle sound intermediate frequency carrier, is amplified in the driver transistor 20 and applied to the base electrode 48 of the oscillator-detector transistor 46. The oscillator-detector circuit is self oscillating at a frequency substantially equal to 4.5 megacycles, which falls on the slope of the resonance curve of the collector tank circuit 56. The frequency modulated wave applied to the oscillator-detector input circuit through the base electrode 48 locks the frequency of oscillations in with the frequency of the frequency-modulated wave. The variations in the frequency of oscillations vary the impedance of the collector tank circuit 56 in the output circuit and thus vary the collector current in accordance with the frequency deviations of the frequency modulated wave. The detector output voltage is developed across the load resistor 62, amplified in the audio power amplifier 148, and delivered to the loudspeaker 150 where the electrical signals are reproduced as sound.

The circuit of FIGURE 3 was construed using the following components and values: Transistors 20 and 46 are type 2N247; Capacitors 104, 108, 42, 132, 134, 58, 68 are 2.7, 220, 22, 22, 220, 27, and 27 micromicrofarads, respectively; Capacitors 30, 118, 141, and 146 are 0.022, 0.01, 0.001, and 0.001 microfarad, respectively; Capacitors 110, 120, 126, and 136 are variable 4 to 30, 1.5 to 7, 1.5 to 7, and 1.5 to 7 micromicrofarads, respectively; Resistors 109, 28, 122, 114, 142, 144, and 62 are 390, 4,700, 1,200, 600, 120,000, 150,000, and 10,000 ohms, respectively; and the inductor 106 is a 22 microhenry choke. The inductor 112 is the lead inductance of the capacitor 3 resonant with the capacitor 30 at 4.3 megacycles. The remaining inductors are pie wound on 1/4 inch diameter coil forms with cores of a ferrite material commercially available as "National Moldite Mix 17." The inductor 36 is 60 turns of No. 36 SNE wire, tapped at 29 turns for the energizing feed and at 35 turns for the neutralization connection; the inductor 130 is of 60 turns of No. 36 SNE wire; the inductor 54 is of 60 turns of No. 36 SNE wire tapped at 29 turns for energizing current feed; the inductor 66 is 60 turns of No. 36 SNE wire; and the inductor 138 is two turns of No. 36 SNE wire wound on the same form as the inductor 66.

Utilizing the circuit of FIGURE 3 with the above-mentioned component values, the oscillator locks over the full ±25 kilocycle deviation of a television sound carrier for an input signal to the driver transistor 20 of 3 millivolts. The amplitude modulation rejection for an input signal above 10 millivolts is between 26 and 50 decibels.

A frequency detector circuit in accordance with the invention is characterized by its relative simplicity and economy and by its increased sensitivity and freedom from spurious amplitude modulation effects.

What is claimed is:

1. A detector circuit for demodulating a frequency-modulated signal wave comprising in combination, an oscillator circuit including a transistor device having an output circuit means providing a parallel resonant circuit connected to be traversed by signal current in said output circuit, feedback means for sustaining oscillations in said oscillator circuit at a frequency on the slope of the resonance curve of said parallel resonant circuit, means connected in said oscillator circuit for limiting the amplitude of said oscillations means for locking the frequency of said oscillations to the instantaneous frequency of a frequency modulated wave, and means for deriving a demodulated output signal from the variation in the average current in said output circuit.

2. A detector circuit for demodulating a frequency-modulated signal wave comprising in combination, an oscillator circuit including a transistor having a signal output electrode, a parallel resonant circuit connected to said electrode, feedback means for sustaining oscillations in said oscillator circuit at a frequency on the slope of the resonance curve of said parallel resonant circuit, resistance-capacitance time-constant means connected to said output electrode for limiting the amplitude of said oscillations, means for locking the frequency of said oscillations to the instantaneous frequency of said signal wave, and means for deriving a demodulated output signal from the average current of said output electrode.

3. A frequency-modulation detector circuit comprising, an oscillator circuit including a transistor having an input circuit and an output circuit and having a parallel-resonant circuit connected in said output circuit, means for the restricting frequency of oscillations of said oscillator circuit to a frequency that falls on the slope of the resonance curve of said parallel-resonant circuit, means connected in said output circuit for limiting the amplitude of said oscillations means connected with said input circuit for locking the frequency of said oscillator to the frequency of a frequency modulated wave applied thereto, and means for deriving a demodulated signal from variation in the current in said output circuit.

4. A frequency-modulation detector circuit comprising, an oscillator circuit including a transistor having signal input and output electrodes and having a parallel-resonant circuit connected to said output electrode, means for restricting the frequency of oscillations of said oscillator circuit to a frequency that falls on the slope of the resonance curve of said parallel-resonant circuit, means connected with said output electrode for limiting the amplitude of said oscillations means connected to said input electrode for locking the frequency of said oscillator to the frequency of a frequency-modulated wave applied to said oscillator circuit, and means for deriving a demodulated signal from variations in the current of said output electrode.

5. In a television signal receiver a detector crcuit for demodulating a frequency-modulated signal wave comprising in combination, a transistor having base, emitter and collector electrodes, a parallel-resonant circuit connected to said collector electrode, means providing a regenerative feedback connection between said collector and emitter electrodes to provide self oscillations at a frequency that falls on the slope of the resonance curve of said parallel-resonant circuit, circuit means connected with said collector electrode for limiting the amplitude of said self oscillations means for applying a frequency-modulated wave to said base electrode to lock the frequency of said oscillations to the frequency of said wave, whereby the impedance of said parallel resonant circuit and the collector current of said transistor vary as the frequency of said self oscillations vary in accordance with the frequency deviations of the frequency modulated wave, and means for deriving a demodulated output signal from variations in the current of said collector electrode.

6. A detector circuit for demodulating a frequency-modulated signal wave comprising in combination, a transistor having base, emitter and collector electrodes, a first parallel-resonant circuit connected between said collector and emitter electrodes, means including a second parallel-resonant circuit providing a regenerative feedback connection between said collector and emitter electrodes to provide self oscillations at a frequency that falls on the slope of the resonance curve of said first parallel-resonant circuit, circuit means connected with said collector electrode for limiting the amplitude of said self oscillations, wave input means for applying a frequency modulated wave between said base and emitter electrodes to lock the frequency of said oscillations to the frequency of said wave, whereby the collector current of said transistor varies in magnitude and direction in accordance with the magnitude and direction of the frequency deviations of the frequency modulated wave, and means for deriving a demodulated output signal from variations in the current of said collector electrode.

7. In a television signal receiver a detector circuit for demodulating a frequency-modulated signal wave comprising in combination a transistor having base, emitter and collector electrodes, a first parallel-resonant circuit connected between said collector and emitter electrodes, means including a second parallel-resonant circuit providing a regenerative feedback connection between said collector and emitter electrodes to provide self oscillations at a frequency that falls on the slope of the resonance curve of said first parallel resonant circuit, means including a resistor-capacitor time-constant network connected with said collector electrode for limiting the amplitude of said self oscillations, wave input means for applying a frequency-modulated signal wave between said base and emitter electrodes to lock the frequency of said oscillations to the frequency of said wave, whereby the collector current of said transistor varies in magnitude and direction in accordance with the magnitude and direction of the frequency deviations of the frequency-modulated wave, and resistive means for deriving a demodulated output signal from variations in the current of said collector electrode.

References Cited in the file of this patent

UNITED STATES PATENTS

| | | |
|---|---|---|
| 1,291,527 | Hull | Jan. 14, 1919 |
| 1,867,567 | Hansell | July 19, 1932 |
| 1,922,290 | Hansell | Aug. 15, 1933 |
| 1,938,657 | Hansell | Dec. 12, 1933 |
| 2,050,963 | Conklin | Aug. 11, 1936 |
| 2,494,795 | Bradley | Jan. 17, 1950 |
| 2,497,290 | Bradley | Feb. 14, 1950 |
| 2,816,220 | Goodrich | Dec. 10, 1957 |
| 2,913,579 | Avins | Nov. 17, 1959 |

OTHER REFERENCES

Carnahan et al.: "Synchronized Oscillators as F-M Receiver Limiters," Electronics, August 1944, pps. 108–111, 332, 334, 336, 338, 340.